(12) United States Patent
Chuang et al.

(10) Patent No.: US 11,981,483 B2
(45) Date of Patent: May 14, 2024

(54) QUICK-RELEASE VALVE MODULE, RETICLE POD PROVIDED WITH QUICK-RELEASE VALVE MODULE, AND METHOD FOR QUICKLY PROVIDING QUICK-RELEASE VALVE MODULE ON A RETICLE POD

(71) Applicant: GUDENG PRECISION INDUSTRIAL CO., LTD., New Taipei (TW)

(72) Inventors: Chia-Ho Chuang, New Taipei (TW); Shu-Hung Lin, New Taipei (TW); Ming-Chien Chiu, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 880 days.

(21) Appl. No.: 16/929,823

(22) Filed: Jul. 15, 2020

(65) Prior Publication Data
US 2021/0048114 A1 Feb. 18, 2021

Related U.S. Application Data

(60) Provisional application No. 62/887,753, filed on Aug. 16, 2019.

(51) Int. Cl.
*B65D 53/06* (2006.01)
*B01D 46/00* (2022.01)
*B01D 46/42* (2006.01)
*B01D 46/54* (2006.01)
*B65D 81/24* (2006.01)
*B65D 85/30* (2006.01)
*B65D 85/38* (2006.01)
*F16K 27/02* (2006.01)
*G03F 1/66* (2012.01)
(Continued)

(52) U.S. Cl.
CPC .......... *B65D 53/06* (2013.01); *B01D 46/001* (2013.01); *B01D 46/4272* (2013.01); *B01D 46/543* (2013.01); *B65D 81/24* (2013.01); *B65D 85/30* (2013.01); *B65D 85/38* (2013.01); *F16K 27/02* (2013.01); *G03F 1/66* (2013.01); *G03F 7/70916* (2013.01); *H01L 21/67359* (2013.01); *H01L 21/67389* (2013.01); *B01D 2271/027* (2013.01); *B01D 2279/51* (2013.01)

(58) Field of Classification Search
CPC ........ B65D 53/06; B65D 81/24; B65D 85/38; B65D 85/30; G03F 7/70916; H01L 21/67359; H01L 21/67389; B01D 46/001; B01D 46/4272; B01D 46/543; B01D 2271/027; B01D 2279/51
See application file for complete search history.

(56) References Cited

U.S. PATENT DOCUMENTS 5,810,062 A * 9/1998 Bonora ............. H01L 21/67393
414/217
5,879,458 A * 3/1999 Roberson, Jr. .... H01L 21/67769
414/217

(Continued)

*Primary Examiner* — Daphne M Barry
(74) *Attorney, Agent, or Firm* — Locke Lord LLP; Tim Tingkang Xia, Esq.

(57) ABSTRACT

The present invention provides a quick-release valve module which includes a flexible grommet defining a channel, and a piston having a disc portion at an end thereof, wherein the disc portion of the piston is exposed to the flexible grommet.

34 Claims, 17 Drawing Sheets

(51) Int. Cl.
*G03F 7/00* (2006.01)
*H01L 21/673* (2006.01)

(56) References Cited

U.S. PATENT DOCUMENTS

| | | | | |
|---|---|---|---|---|
| 6,187,182 B1* | 2/2001 | Reynolds | ........... | B01D 46/0004 210/429 |
| 6,199,604 B1* | 3/2001 | Miyajima | ......... | H01L 21/67393 220/240 |
| 6,319,297 B1* | 11/2001 | Fosnight | ................ | B01D 46/88 55/482 |
| 6,875,282 B2* | 4/2005 | Tanaka | .............. | H01L 21/67393 156/345.31 |
| 7,328,727 B2* | 2/2008 | Tieben | .............. | H01L 21/67379 141/11 |
| 7,455,180 B2 | 11/2008 | Sumi et al. | | |
| 8,146,623 B2* | 4/2012 | Tieben | .............. | H01L 21/67393 414/940 |
| 8,893,753 B2* | 11/2014 | Okabe | .............. | H01L 21/67393 414/935 |
| 9,091,353 B2* | 7/2015 | Lo | .......................... | F16K 15/026 |
| 9,997,388 B2* | 6/2018 | Smith | ............... | H01L 21/67393 |
| 10,347,517 B2* | 7/2019 | Smith | ............... | H01L 21/67393 |
| 10,781,774 B2* | 9/2020 | Delgado | ............ | B01D 46/0005 |
| 10,876,647 B2 | 12/2020 | Chiu et al. | | |
| 10,923,373 B2* | 2/2021 | Ogawa | ................ | H01L 21/67379 |
| 2005/0077204 A1* | 4/2005 | Sumi | ................ | H01L 21/67379 206/710 |
| 2006/0266011 A1* | 11/2006 | Halbmaier | ........ | H01L 21/67017 55/385.6 |
| 2008/0260498 A1* | 10/2008 | Nagata | ............... | H01L 21/67775 414/217 |
| 2009/0114563 A1* | 5/2009 | Yeh | .................... | H01L 21/67393 206/454 |
| 2009/0266441 A1* | 10/2009 | Sato | ....................... | F16K 15/063 141/98 |
| 2009/0301917 A1* | 12/2009 | Kolbow | ............ | H01L 21/67359 206/454 |
| 2010/0051501 A1* | 3/2010 | Corbin, Jr. | ........ | H01L 21/67393 206/710 |
| 2012/0037522 A1* | 2/2012 | Chiu | ................ | H01L 21/67359 206/316.1 |
| 2015/0041353 A1* | 2/2015 | Adams | ............... | H01L 21/67379 206/454 |
| 2017/0213752 A1* | 7/2017 | Ogawa | ............... | H01L 21/67386 |
| 2017/0271188 A1* | 9/2017 | Fuller | ............... | H01L 21/67393 |
| 2017/0294329 A1* | 10/2017 | Gregerson | ........ | H01L 21/67393 |
| 2018/0247849 A1* | 8/2018 | Glavan | ............. | H01L 21/67376 |
| 2019/0211942 A1* | 7/2019 | Chiu | ................ | B01D 46/4272 |
| 2019/0393062 A1* | 12/2019 | Ogawa | ............... | H01L 21/67326 |
| 2020/0020549 A1* | 1/2020 | Ogawa | ................ | H01L 21/6732 |
| 2020/0343117 A1* | 10/2020 | Eggum | ............. | H01L 21/67376 |
| 2021/0032014 A1* | 2/2021 | Ogawa | .................. | H01L 21/673 |
| 2021/0111048 A1* | 4/2021 | Narita | ............... | H01L 21/67126 |
| 2021/0118713 A1* | 4/2021 | Matsutori | ......... | H01L 21/67379 |
| 2021/0148479 A1* | 5/2021 | Ogawa | .................... | F16K 15/02 |
| 2021/0323756 A1* | 10/2021 | Chiu | ............... | H01L 21/67386 |
| 2021/0358787 A1* | 11/2021 | Chiu | ................ | B65D 85/30 |
| 2022/0054787 A1* | 2/2022 | Dwyer | ............... | B01D 46/521 |
| 2022/0199439 A1* | 6/2022 | Narita | ............... | H01L 21/67386 |
| 2022/0344186 A1* | 10/2022 | Toda | ............... | H01L 21/67383 |
| 2023/0054753 A1* | 2/2023 | Chiu | ................ | H01L 21/67366 |
| 2023/0065892 A1* | 3/2023 | Chiu | ................ | H01L 21/67389 |

* cited by examiner

QUICK-RELEASE VALVE MODULE, RETICLE POD PROVIDED WITH QUICK-RELEASE VALVE MODULE, AND METHOD FOR QUICKLY PROVIDING QUICK-RELEASE VALVE MODULE ON A RETICLE POD

RELATED APPLICATIONS

This application claims priority to and the benefit of U.S. Provisional Application No. 62/887,753 filed Aug. 16, 2019. The entire disclosure of which is incorporated by reference herein.

BACKGROUND

Technical Field

The present disclosure relates to a quick-release valve module, more particularly to a quick-release valve module provided on an outer pod of a reticle pod.

Description of Related Art

The Standard Mechanical Interface (SMIF) system developed by Hewlett-Packard are generally adopted by manufacturers in the semiconductor industry for transporting and storing devices for wafers and reticles. The SMIF system serves to ensure that the air surrounding the wafers and reticles remains stationary relative to the wafers and reticles in the course of transportation and storage, and that particles in the clean room do not enter the area adjacent to the wafers and reticles.

Therefore, a transport container in an SMIF system is required to be sufficiently airtight in order to prevent air or particles in the ambient environment from entering the container. To prevent oxidation of the wafer surface or organic pollution thereon, gases such as nitrogen, inert gas or dehydrated dry gas (less than 1% water) may be further filled into the wafer container. As a result, a valve may be provided on the transport container to ensure smooth filling of gases as well as to prevent gas leakage from the transport container.

The opening and closing of prior art valves are typically actuated by means of metal springs disposed therein. Such design usually leads to friction between actuated springs or between the springs and valve walls, thereby causing metal particles to enter the transport container. Consequently, wafers or reticles are contaminated and the entire manufacturing process is affected.

In addition, valves that are commercially available today require constant replacements due to elastic fatigue, in order to maintain a stable yield during the manufacturing process. Generally, an entire valve module, rather than its individual components, needs to be replaced, thus increasing the production cost.

As disclosed in Taiwan Invention Patent No. 1423451, prior art valves are typically disposed in valve seats provided on the base; a cover is also provided on the base to secure the valve. Therefore, replacing a valve requires the back cover of the transport container base to be removed first, so that the valve can be released from the valve seat. This method for replacing valves creates obstacles during the replacement process and tends to cause particles to adhere at the bottom within the transport container. As a result, there is a chance that particles will enter the container through the valve and contaminate the reticles or wafers.

With the advancement in wafer processing technologies, there is an increasing demand for techniques preventing particles from entering transport containers in wafer-related processes, such as an EUV (extreme ultraviolet) lithography process. The present invention provides a quick-release valve module with a main body that can be assembled easily, can be quickly mounted on the transport container and can reduce the number of particles entering the container; the present invention also provides a manufacturing process thereof. The quick-release valve module and the manufacturing process thereof according to this invention are likely to achieve better industrial applicability.

SUMMARY OF THE INVENTION

An object of the present invention is to provide a quick-release valve module that can prevent particles from gathering, as well as a method for manufacturing the valve module, in order to overcome certain shortcomings, such as difficulties in assembling the valve modules and mounting the valve modules on the base of the reticle pod, with prior art valve modules.

To achieve the aforementioned object, the present invention provides a quick-release valve module, adapted for used in an air passage, including: a flexible grommet defining a channel; a cylindrical base received at least in part in the channel; a filter module configured to filter an air flow from the channel; a piston having a disc portion at an end thereof and another end of the piston receiving within the cylindrical base; and an elastic member disposed between the another end of the piston and the filter module, wherein the disc portion of the piston is exposed to the flexible grommet.

In one embodiment, the piston includes a rod portion having an inner passage and the disc portion radially extending from the rod portion, the rod portion is slidable relatively to the cylindrical base under an external force applied to the disc portion, and whereby the inner passage of the rod portion and the air passage communicate with each other.

In one embodiment, the disc portion is configured to seal the channel of the flexible grommet when an external force is applied thereto and depart from the flexible grommet when no external force is applied.

In one embodiment, the filter module has a support member extending in the cylindrical base to push against the elastic member.

In one embodiment, the flexible grommet has an annular sealing surface radially extending from an edge of the channel, the annular sealing surface is configured to cooperate with the disc portion of the piston to form a sealing.

In one embodiment, the flexible grommet has a groove formed at the peripheral thereof, the groove is configured for engagement with an annular securing member which is used for locking the quick-release valve module in the air passage.

In one embodiment, the rod portion is provided with a sealing ring which forms a sealing between the rod portion and the cylindrical base.

In one embodiment, the disc portion of the piston is further provided with an elastic sealing ring and a groove receiving the elastic sealing ring.

In one embodiment, the disc portion of the piston is further provided with an elastic sealing band radially extending inward so as to fit the circumference of the disc portion.

In one embodiment, the disc portion of the piston is further provided with an elastic sealing pad.

In one embodiment, the flexible further includes plural elastic flaps which are configured to form a sealing with a valve seat defining the air passage when the quick-release valve module is received in the air passage.

In one embodiment, the cylindrical base, at a side that faces the disc portion of the piston, is further provided with an elastic sealing ring.

In one embodiment, the elastic sealing ring is configured to form a sealing between the disc portion and the cylindrical base when the disc is pushed by a gas filling panel.

To achieve the aforementioned object, the present invention further provides a method for providing the foregoing quick-release valve module in a reticle pod, the reticle pod comprising a base with a base board, the base provided with plural valve seats each of which defines an air passage, and the base board having plural openings corresponding to the valve seats. The method includes providing an annular securing member at a periphery of the flexible grommet; passing the quick-release valve module having the annular securing member through the opening of the base board, and receiving a part of the flexible grommet in the valve seat of the base; and forcing the annular securing member to push against an edge of the opening in order to secure the quick-release valve module in the valve seat.

To achieve the aforementioned object, the present invention further provides a quick-release valve module, including: a flexible grommet having a channel defined therein, a restricting surface perpendicular to the extension of channel and a side surface adjacent to the restricting surface; and an annular securing member matching with the side surface of the flexible grommet and having at least one ear portion which is configured to cooperate with at least one notch of an opening defined on a reticle pod base in order to selectively install the flexible grommet.

In one embodiment, the annular securing member further touches against the restricting surface of the flexible grommet.

In one embodiment, the side surface adjacent to the restricting surface further has a recessed surface defined thereon, and the annular securing member matches with the recessed surface of the side surface.

In one embodiment, the flexible grommet further has an annular sealing surface extending from an edge of the channel.

In one embodiment, the ear portion protrudes to a radius out of the restricting surface of the flexible grommet.

To achieve the aforementioned object, the present invention further provides a method for loading a quick-release valve module in a reticle pod. The method includes: providing a base having an opening formed thereon and configured to receive the quick-release valve module, wherein the opening has at least one notch; providing the quick-release valve module comprising a flexible grommet and an annular securing member, wherein the flexible grommet has a channel defined therein, a restricting surface perpendicular to the extension of the channel and a side surface adjacent to the restricting surface, the annular securing member matches with the side surface of the flexible grommet and has at least one ear portion; and passing the flexible grommet and the ear portion through the opening and notch of the base and rotating the annular securing member to selectively install the flexible grommet.

In one embodiment, the base has a base board that defines the opening, and the base board is pushed by the ear portion after a rotation of the ear portion so that the flexible grommet is installed.

In one embodiment, the base has a valve seat coupled to an interior of the reticle pod, a periphery of the flexible grommet and the valve seat form a sealing, and the channel of the flexible grommet communicates with the interior of the reticle pod.

In one embodiment, the annular securing member further touches against the restricting surface of the flexible grommet.

In one embodiment, the side surface adjacent to the restricting surface further has a recessed surface defined thereon, and the annular securing member matches with the recessed surface of the side surface.

DETAILED DESCRIPTION OF THE EMBODIMENTS

Embodiments of the present invention will be described below with reference to the schematic views of preferred configurations of the present invention. Shapes and configurations shown in the schematic views will differ due to manufacturing techniques, designs and/or tolerances. Therefore, the embodiments provided herein shall not be construed as limiting the present invention to specific components or shapes; instead, they shall comprise any shape differences caused by the manufacturing process.

Figure 1:
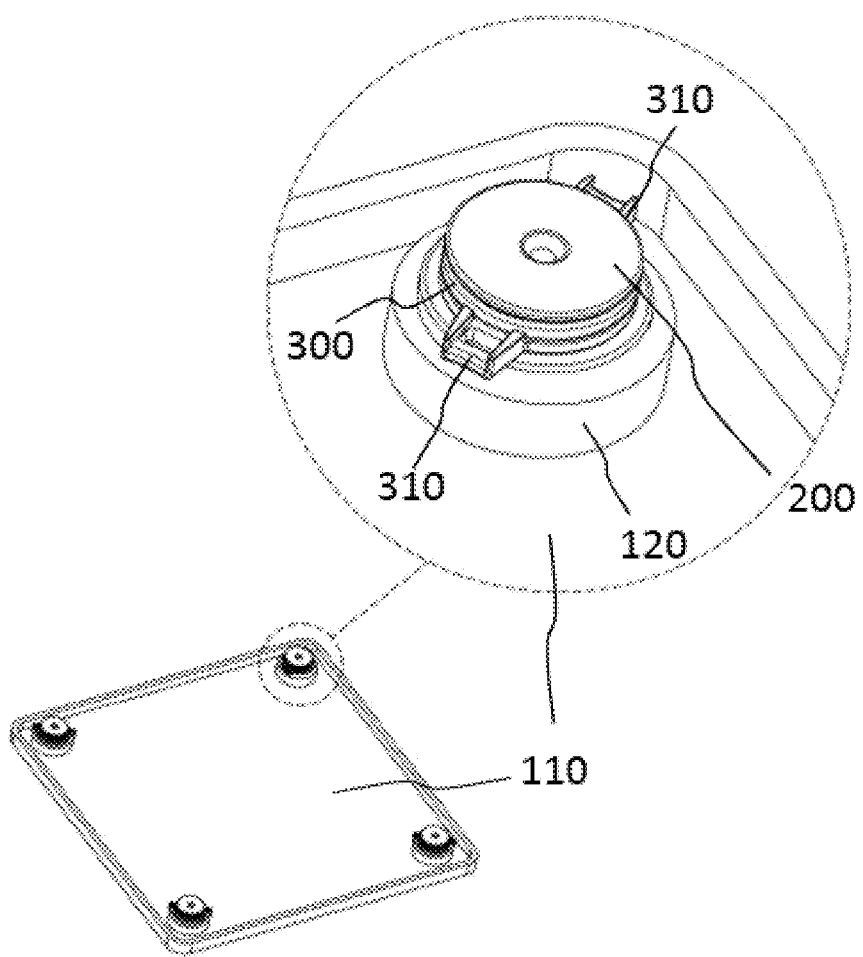
FIG. 1 is an enlarged schematic view of a quick-release valve module disposed on the base of a reticle pod according to an embodiment of the invention.

As shown in FIG. 1, a base 110 of a reticle pod is provided with a plurality of valve seats 120, a plurality of quick-release valve modules 200 corresponding to the valve seats 120, and a plurality of annular securing members 300 that engage with the side surfaces of the plurality of quick-release valve modules 200. A pair of ear portions 310 extends from each annular securing member 300. In this embodiment, a plurality of valve seats 120 and the corresponding quick-release valve modules 200 are preferably disposed at the tips of the four corners of the base 110, but other configurations are also possible.

Figure 2A:
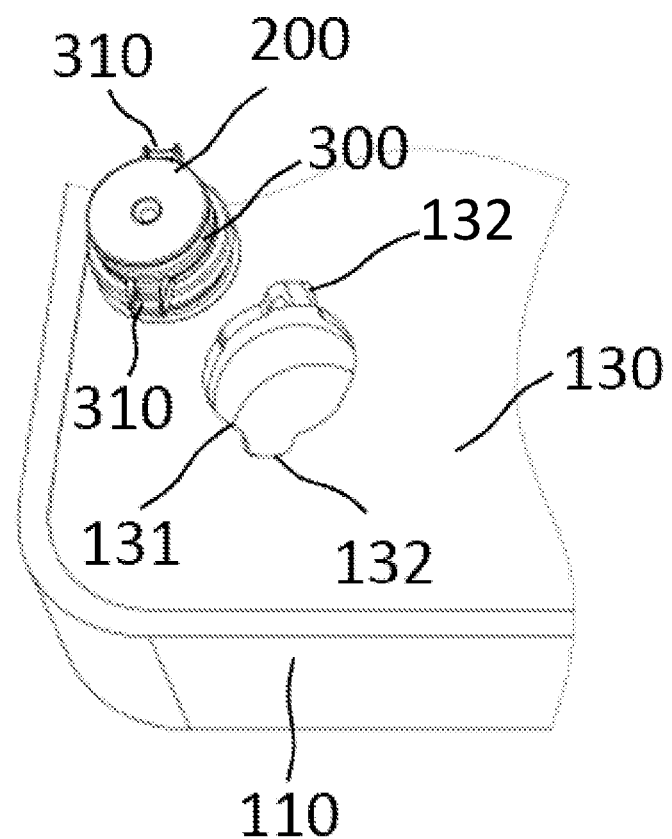
FIGS. 2a to 2c are schematic views showing how to quickly mount the quick-release valve module onto the base of the reticle pod.

The following description explains how to quickly mount the quick-release valve module 200 on the base of the reticle pod. As shown in FIG. 2a, the base of the reticle pod contains a base board 130 having a plurality of openings 131 whose number corresponds to that of the valve seats 120. The opening 131 and the inside of the valve seat 120 form an air passage. The base board 130 also as a pair of concave notches 132, each of which is larger than each ear portion 310 of the annular securing member 300. As such, the pair of ear portions 310 can pass through the pair of notches 132, and the annular securing member 300 can pass through the opening 131 as well. The shape and number of the notches 132 correspond to those of the ear portions 310, and are thus not limited to the shapes described in the embodiments herein.

Figure 2B:
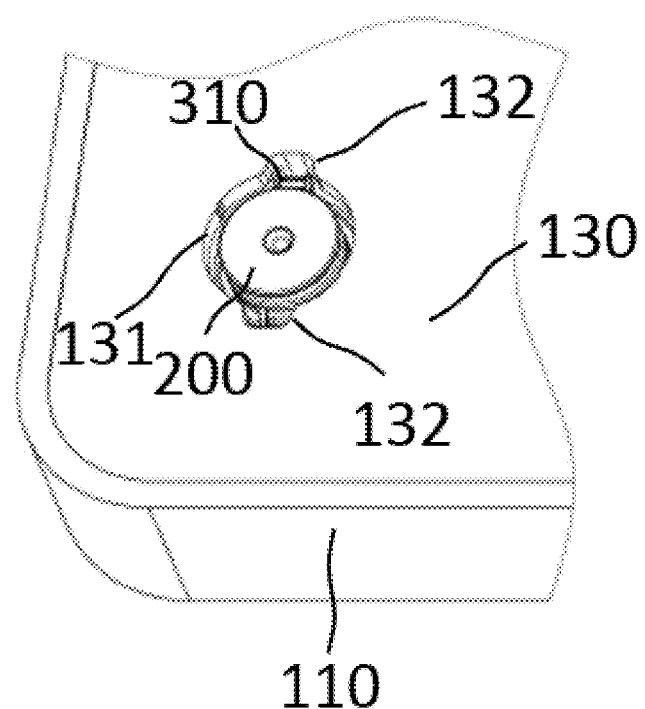

As shown in FIG. 2b, the user can make the quick-release valve module 200 having the annular securing member 300 pass through the opening 131 and the pair of notches 132, and then secure the quick-release valve module 200 into the valve seat 120.

Figure 2C:
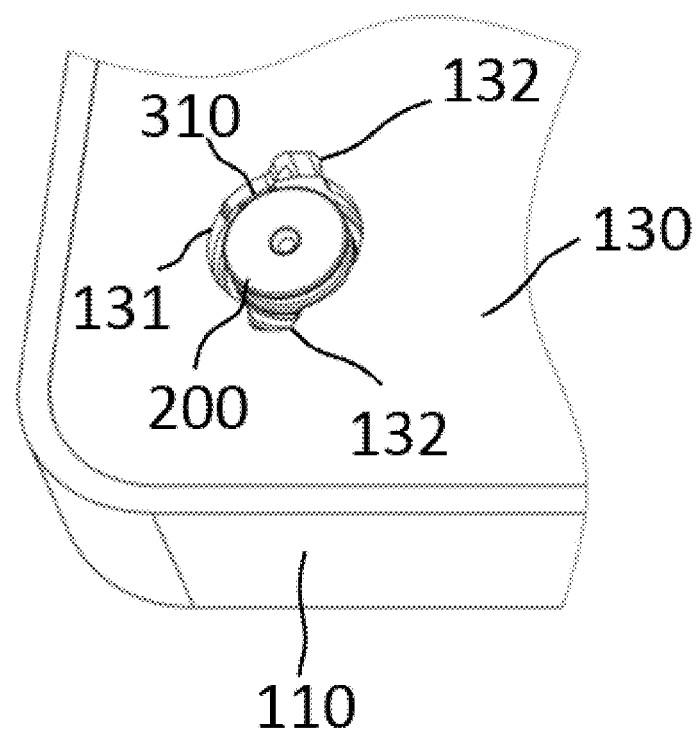

Then, as shown in FIG. 2c, the pair of ear portions 310 of the annular securing member 300 can be rotated in the circumferential direction by the user using a tool or barehandedly, so that the annular securing member 300 is able to cause the quick-release valve module 200 to be screwed into the valve seat 120 while the pair of ear portions 310 are screwed onto the edge of the opening 131 (at positions other than where the notches 132 are located). As a result, the pair of ear portions 310 of the annular securing member 300 will press against a surface within the inner space of the base board 130, thereby securing the quick-release valve module 200 into the valve seat 120 without becoming loose.

Prior art methods require that the base board be dismantled first and the valve secured to the valve seat be removed and taken out next. By contrast, the present invention provides a method as detailed above for disposing the quick-release valve module 200 on the reticle pod, by which method the pair of ear portions 310 can be directly screwed onto the edge of the opening 131 or into the pair of notches 132; therefore, the quick-release valve module 200 can be directly disposed in or removed from the valve seat 120 without dismantling the base board.

Figure 3:
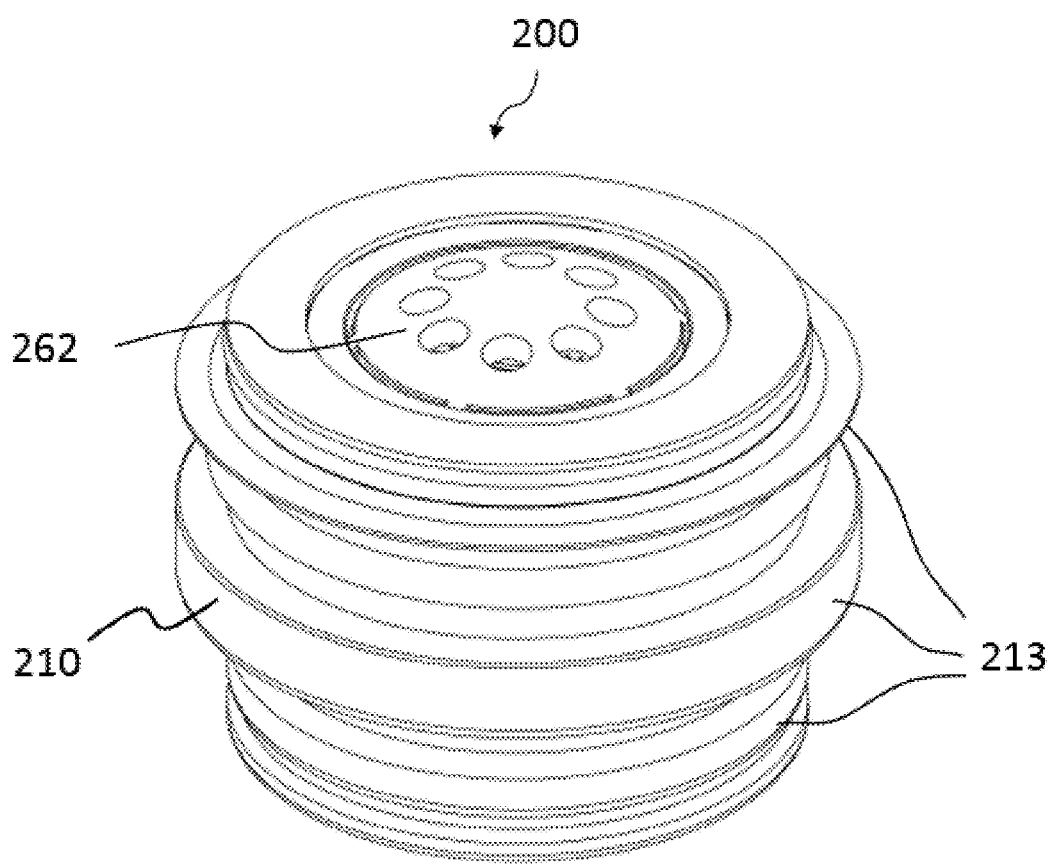
FIG. 3 is a perspective view from the outside of the quick-release valve module.
Figure 4:
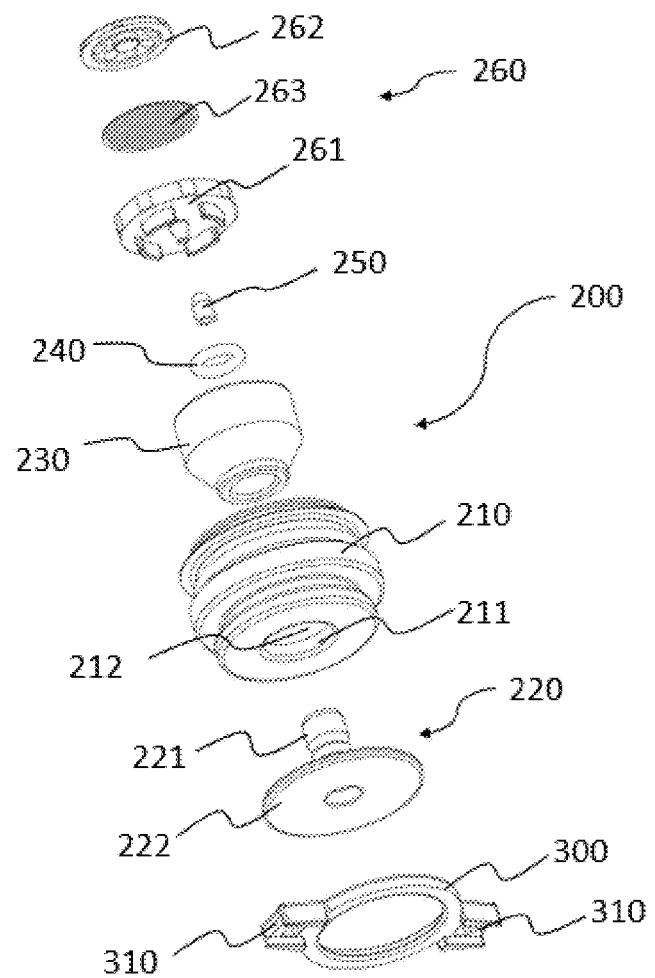
FIG. 4 is an exploded view of the quick-release valve module.
Figure 5:
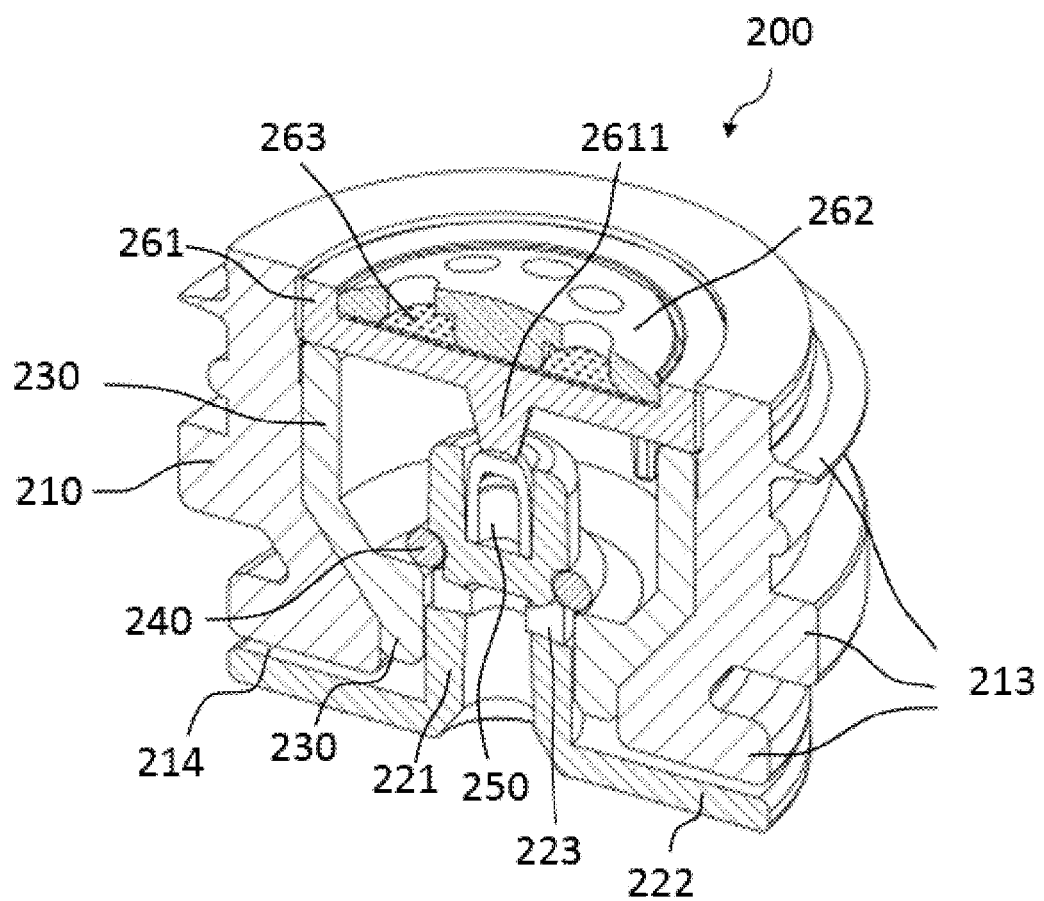
FIG. 5 is a cross-sectional view of the quick-release valve module.

The following description explains the structure of the quick-release valve module 200 with reference to FIGS. 3 to 5. FIG. 3 is a perspective view from the outside of the quick-release valve module 200; FIG. 4 is an exploded view of the quick-release valve module 200; and FIG. 5 is a cross-sectional view of the quick-release valve module 200 depicted in FIG. 1, an enlarged schematic view. As these drawings show, the quick-release valve module 200 comprises a flexible grommet 210, a piston 220, a cylindrical base 230, a sealing ring 240, an elastic member 250, and a filter module 260, wherein the flexible grommet 210 has a channel 212 extending in a vertical direction within it and a groove is formed on the outside of the flexible grommet 210. The groove is used for receiving the annular securing member 300 mounted thereon, and the annular securing member 300 is used for locking the gas channel which is formed by the inside of the valve seat 120 in conjunction with the inside of the quick-release valve module 200 that is received in the opening 131. In addition, the flexible grommet 210 further comprises a plurality of elastic flaps 213 formed on the outside; the elastic flaps 213 engage with the inner wall of the valve seat 120 to form a hermetic seal by means of elastic force. The cylindrical base 230 and the filter module 260 can be received within the channel 212, and the flexible grommet 210 fits the cylindrical base 230 and the filter module 260 closely, by means of elastic force, so that the three of them form a hermetic seal. The cylindrical base 230 and the flexible grommet 210 corresponding thereto are formed as one piece and have a wider channel, from which extends a cylinder with a narrower channel. Also, the flexible grommet 210 extends from the edge of the channel 212 in a radial direction and forms an annular sealing surface 214. In other possible embodiments, said flexible grommet may be of a larger or smaller size, but is still configured to have similar connections to provide similar functions.

The filter module 260 comprises a filtering membrane holder 261 for receiving and securing a filtering membrane cap 262, which allows fluid to pass through (for the convenience of the reader, details of the fluid passing through the filtering membrane cap are not depicted in the drawings). A filtering membrane 263 is disposed between the filtering membrane holder 261 and the filtering membrane cap 262. The filtering membrane 263 can be secured onto the filtering membrane holder 261 by means of the filtering membrane cap 262, and is thereby fastened between the filtering membrane holder 261 and the filtering membrane cap 262. Furthermore, opposite the side where the filtering membrane holder 261 receives the filtering membrane cap 262, the filtering membrane holder 261 includes a support member 2611 extending from the central surface on that side, wherein the axis of the support member 2611 is close to or equivalent to that of the piston 200. On the same side where the support member 2611 extends, a plurality of locking members 2612 extend from the surface of the filtering membrane holder 261 near the peripheral edge thereof. The circumference formed by the plurality of locking members 2612 has an outer diameter that approximates or equals to the inner diameter formed by the wider channel of the cylindrical base 230. As such, the filter module 260 can be locked onto the cylindrical base 230 by means of the plurality of locking members 2612.

As shown in FIGS. 4 and 5, the piston 220 comprises a straight rod portion 221 and a disc portion 222 extending from the straight rod portion 221; the disc portion 222 can form a hermetic seal in conjunction with the annular sealing surface 214. A plurality of hollow air holes 223 are disposed on the wall of the straight rod portion 221; the air holes 223 allow gas to pass through the interior and exterior of the piston 220. In addition, a sealing ring 240 is disposed on the upper edge of the air holes 223. Specifically, the sealing ring 240 is preferably disposed on the outer wall of the straight rod portion 221 and near the air holes 223. Furthermore, an elastic member 250 is disposed at the end of the piston 220 that faces the inner part of the cylindrical base 230. The elastic member 250 can be directly disposed on the end portion of the straight rod portion 221; preferably, the straight rod portion 221 includes a space for containing the elastic member 250, so that the elastic member 250 can be secured to the end portion of the straight rod portion 221 without falling off due to external factors.

Therefore, said piston 220, which is provided with the sealing ring 240 and the elastic member 250, is disposed within the narrower channel of the cylindrical base 230. More specifically, the outer diameter of the straight rod portion 221 of the piston 220 is equal to the inner diameter of the narrower channel of the cylindrical base 230, so that the outer wall of the straight rod portion 221 can fit the inner wall of the narrower channel of the cylindrical base 230. One end of the straight rod portion 221 is provided with the sealing ring 240 and the elastic member 250. The sealing ring 240 and the elastic member 250 are disposed within the inner space formed by the wider channel of the cylindrical base 230. By contrast, the other end of the straight rod portion 221 can slide within the narrower channel of the cylindrical base 230. Meanwhile, the disc portion 222 extending from the straight rod portion 221 is disposed on the outside of the piston 220 and the cylindrical base 230.

As the filter module 260 is secured to the cylindrical base 230, the support member 2611 of the filter module 260 is disposed inside the wider channel of the cylindrical base 230 and is aligned with the axis of the piston 220. Thus, the support member 2611 can contact the elastic member 250 of the piston 220. When the piston 220 is not activated, it will not press the support member 2611 as stated above. The components form an appearance as shown in FIG. 2, with a structure of the quick-release valve module as shown in FIG. 4.

Figure 6:
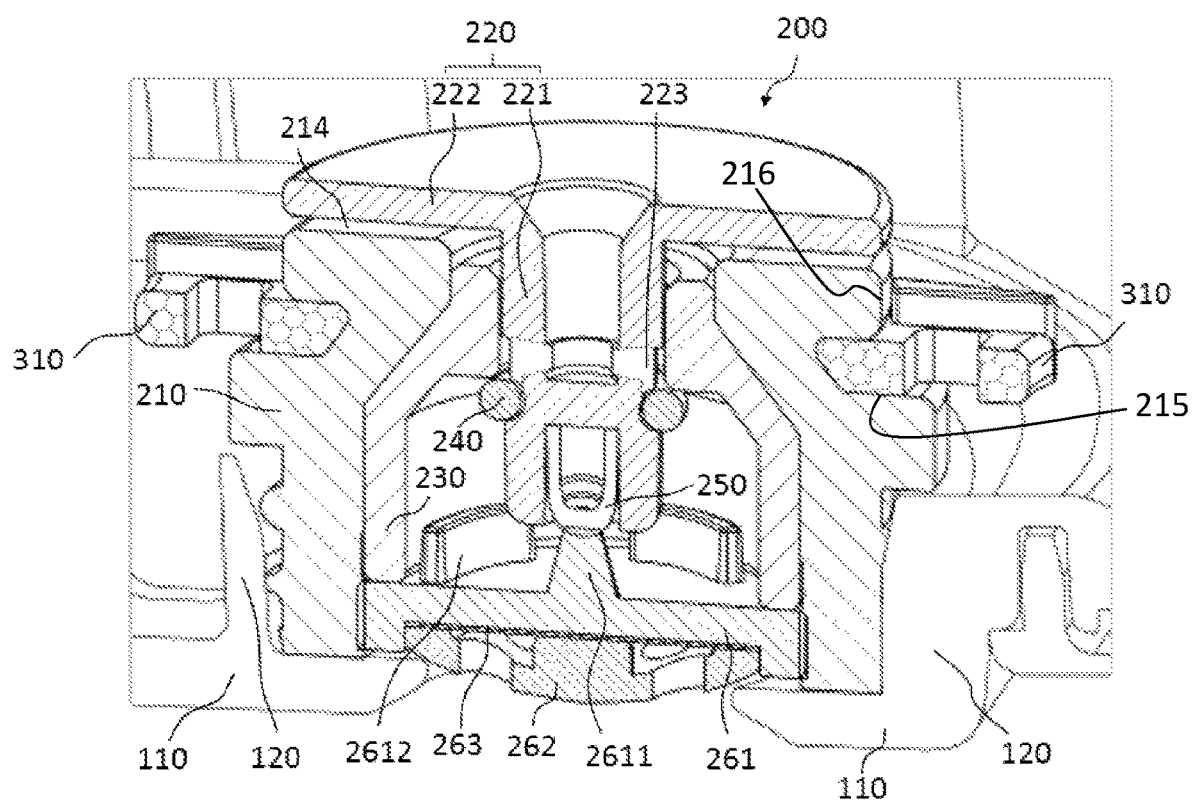
FIG. 6 is a cross-sectional view of the quick-release valve module depicted in the enlarged schematic view of FIG. 1.

The following description explains how the user assembles the quick-release valve module with reference to both FIG. 6 and FIG. 4. First, the filtering membrane 263 is laid flat on the filtering membrane holder 261, and the filtering membrane cap 262 is then secured onto the filtering membrane holder 261 to form the filter module 260; next, the elastic member 250 is disposed in and secured to the straight rod portion 221. These steps constitute the preparation work prior to assembling the whole valve module and can be arranged freely in other sequences.

Then, the cylindrical base 230 is disposed within the flexible grommet 210 and the straight rod portion 221 of the piston 220 is disposed within the cylindrical base 230 through the narrower channel of the cylindrical base 230. The sealing ring 240 is placed through the wider channel of the cylindrical base 230 and secured onto the straight rod portion 221, right above the upper edge of the air holes 223; because of the sealing ring 240, the piston will not fall out of the cylindrical base 230. Next, the support member 2611 of the filter module 260 is aligned with the axis of the straight rod portion 221, and the filter module 260 is secured onto the cylindrical base 230 to form the quick-release valve module 200 (as shown in FIG. 2). Finally, the annular securing member 300 is fitted and engaged onto the outside of the flexible grommet 210 of the quick-release valve module 200 at the end that is close to the disc portion 222.

The quick-release valve module 200 as described above can be disposed and assembled more quickly than other commercially available valves. The valve module can be assembled more efficiently without producing friction-caused particles which may cause damage to the reticle. The quick-release valve module 200 is further advantageous in that when the constituent parts of the valve module are overused and need replacement, they can be replaced more quickly and conveniently without having to replace the entire valve. For example, when particles are piled on the filtering membrane 263 and the membrane needs to be replaced, the replacement can be done by simply taking up the filtering membrane cap 262, replacing the filtering membrane 263 and putting back the cap. When the sealing ring 240 or the elastic member 250 needs to be replaced due to elastic fatigue or damage, replacement can be done by simply opening the filter module 260 and replacing the elastic member 250 or sealing ring 240 on the straight rod portion 221.

The flexible grommet 210 further has a restricting surface 215 generally perpendicular to an inner wall 211 (shown in FIG. 4) and a side surface 216 adjacent to the restricting surface 215. The restricting surface 215 and the side surface 216 are presented at the periphery of the flexible grommet 210, wherein the restricting surface 215 may be formed by a flange (not numbered) externally formed on the flexible grommet 210, and the restricting surface 215 generally parallel to the annular sealing surface 214 so as to restrict annular securing member 300 and ear portion 310. The side surface 216 extends between the annular sealing surface 214 and the restricting surface 215. Alternatively, the side surface 216 is a surface with a diameter less than that of said flange. The restricting surface 215 and the side surface 216 define a match portion for matching and connecting with the annular securing member 300. As shown in the figure, the side surface 216 may further have a recessed surface (not numbered) formed thereon for matching with the annular securing member 300. The recessed surface connects to the restricting surface 215 such that the annular securing member 300 can also touch against the restricting surface 215. The ear portion 310 radially protrudes the restricting surface 215. In some embodiments, the annular securing member 300 and the ear portion 310 can be integrated with the flexible grommet 210.

Figure 7A:
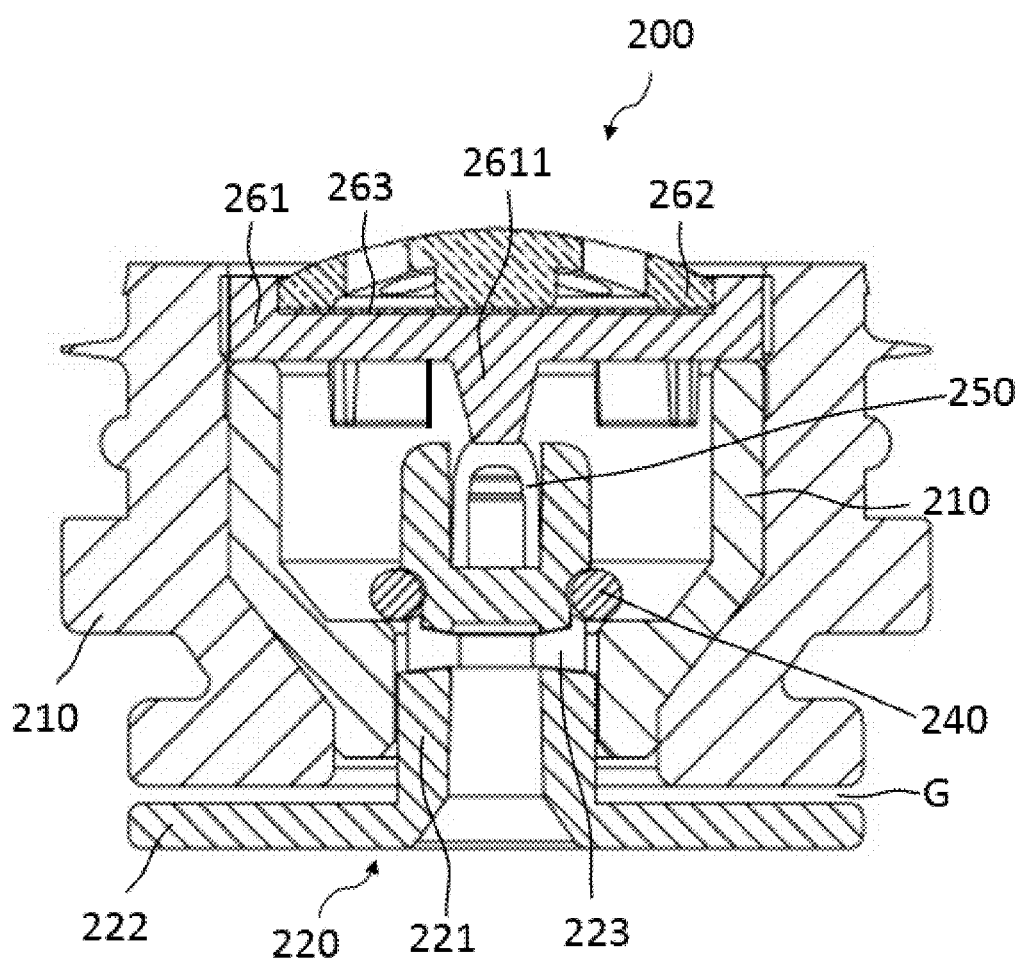
FIG. 7a is a cross-sectional view of the quick-release valve module before the gas filling process.

FIG. 7*a* is a cross-sectional view of the quick-release valve module before the gas filling process. As shown in the figure, external force has not been exerted on the piston 220 of the quick-release valve module 200 yet (i.e., the piston 220 is not being pressed by a gas filling panel 400); thus, the elastic member 250 disposed in the groove of the straight rod portion 221 is only being slightly pressed by the support member 2611, and the sealing ring 240 presses against the opening end of the narrower channel near the inner space of the cylindrical base 230. This ensures that the piston 220 does not slide within the channel of the cylindrical base 230. Meanwhile, the disc portion 222 of the piston 220 does not contact the flexible grommet but forms a gap G along with the cylindrical base 230. Given that the air holes 223 are now positioned within the narrower channel of the cylindrical base 230, and that the sealing ring 240 blocks the opening end of the narrower channel to form a hermetic seal, fluid (gas) will not flow into the inner space of the cylindrical base 230 along the path created by the piston 220. In other words, no fluid can flow into the reticle pod through the path created by the quick-release valve module 200 and the valve seat 120 connected thereto.

Figure 7B:
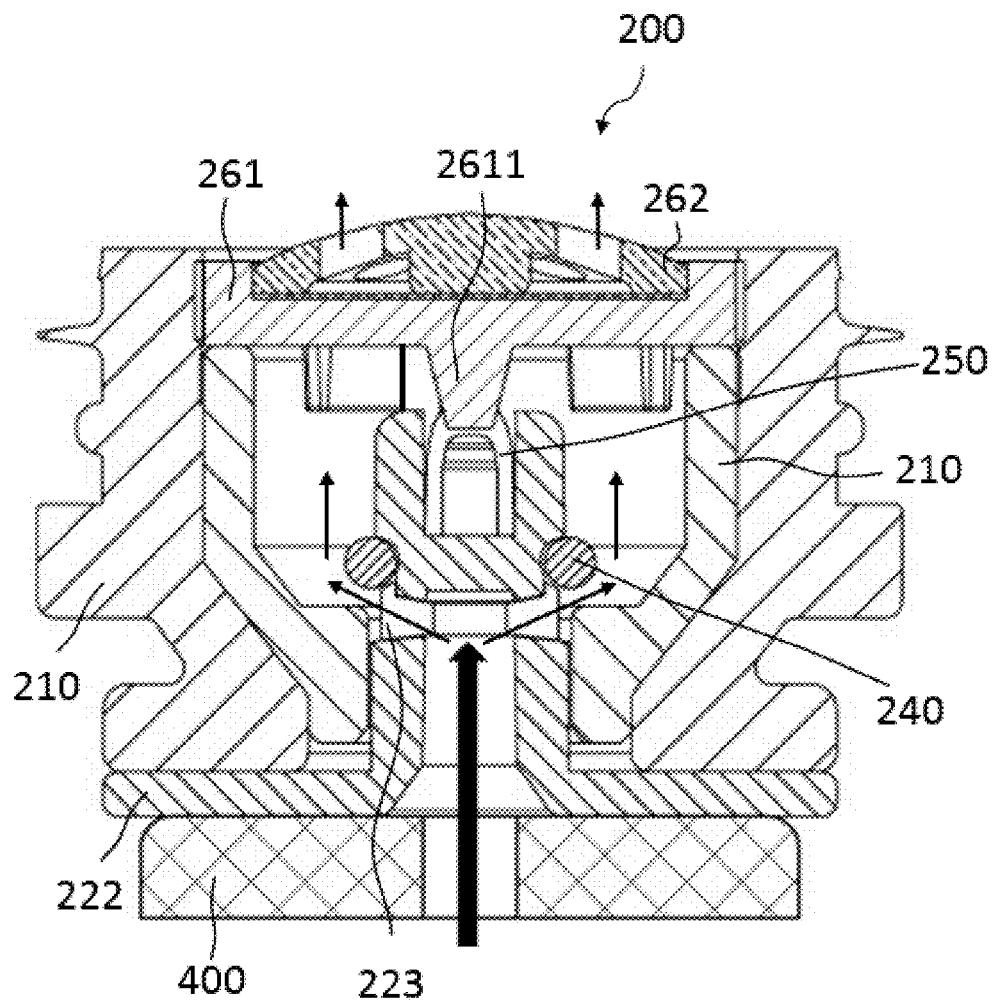
FIG. 7b is a cross-sectional view of the quick-release valve module during the gas filling process.

FIG. 7*b* is a cross-sectional view of the quick-release valve module 200 during the gas filling process. The quick-release valve module 200 is now disposed on the valve seat 120, which is located on the base 110 of the reticle pod (the valve seat 120 is not shown in FIG. 7*b* for ease of explanation). When the gas filling process is performed on the reticle pod, the gas filling panel 400 becomes bonded to the disc portion 222 of the piston 220 in a top-to-bottom direction (for ease of understanding, the gas filling panel 400 shown in FIG. 7*b* is bonded to the disc portion 222 in a direction which is upside-down compared to the actual direction; that is, in the actual process, the gas filling panel 400 is placed on the top and faces downward, while the quick-release valve module 200 is placed at the bottom, with the disc portion 222 facing upward), and pushes the disc portion 222 to the external surface formed by both the flexible grommet 210 and cylindrical base 230, so that the disc portion 222 becomes completely bonded to the external surface to form a hermetic seal. In the meantime, the gas filling panel 400 drives the disc portion 222 of the piston 220 to move the length of the gap G; accordingly, the straight rod portion 221 slides the length of the gap G toward the inner space of the wider channel within the cylindrical base 230. During this process, the air holes 223 also slide (or are exposed) from the narrower channel of the cylindrical base 230 toward the inner space of the wider channel within the cylindrical base 230. In addition, the sealing ring 240 shifts toward the wider channel of the cylindrical base 230 in a similar fashion. As a result, the flow of the fluid will not be blocked.

When the gas filling panel 400 entirely pushes the disc portion 222 to the external surface formed by both the flexible grommet 210 and the cylindrical base 230, the piston 220 will be stopped from moving. And as the pushing force of the gas filling panel 400 is greater than the elastic resilience of the elastic member 250, the piston 220 will not be pushed back; in other words, the piston 220 is secured in place and will slide no more.

When the gas filling process for the reticle pod begins, a pressurized fluid (compressed gas) is supplied from the gas filling panel 400. The fluid flows from the gas filling panel 400 into the inside of the straight rod portion 221 of the piston 220 according to the arrow direction shown in FIG. 7b, and then flows into the wider channel of the cylindrical base 230 via the air holes 223 of the straight rod portion 221, and finally flows out of the filter module 260. While the fluid flows through the filter module 260, particles that are present in the fluid are absorbed to the filtering membrane 263, and the fluid flowing out of the filter module 260 will thus become clean.

When the gas filling process for the reticle pod ends, as shown in FIG. 7a, the gas filling panel 400 ceases to supply gas and will move away from the disc portion 222. In the meantime, the elastic member 250 has an elastic rebounding force because it is being pressed by the support member 2611, and also, the pushing force coming from the gas filling panel 400 now disappears; as a result, the piston 220 slides toward the initial position with the help of the elastic rebounding force from the elastic member 250, until the sealing ring 240 is engaged onto the end portion of the narrower channel of the cylindrical base 230. Finally, the piston 220 is stopped from moving, and the disc portion 222 moves back to the initial position, where the disc portion 222 and the external surface, formed by the flexible grommet 210 and cylindrical base 230, keep a gap G between them.

Figure 8A:
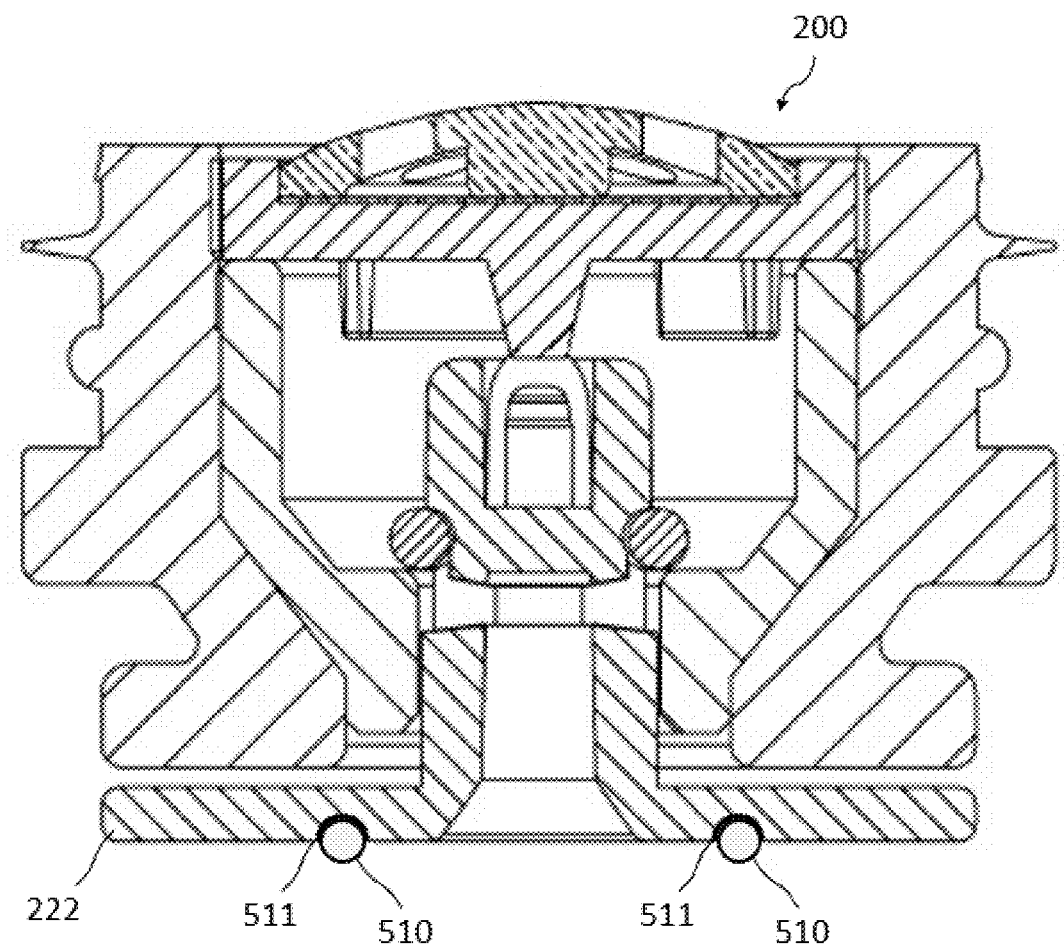
FIG. 8a is a cross-sectional view of the quick-release valve module with an elastic sealing ring and a groove for receiving the elastic sealing ring according to an embodiment of the invention.
Figure 8B:
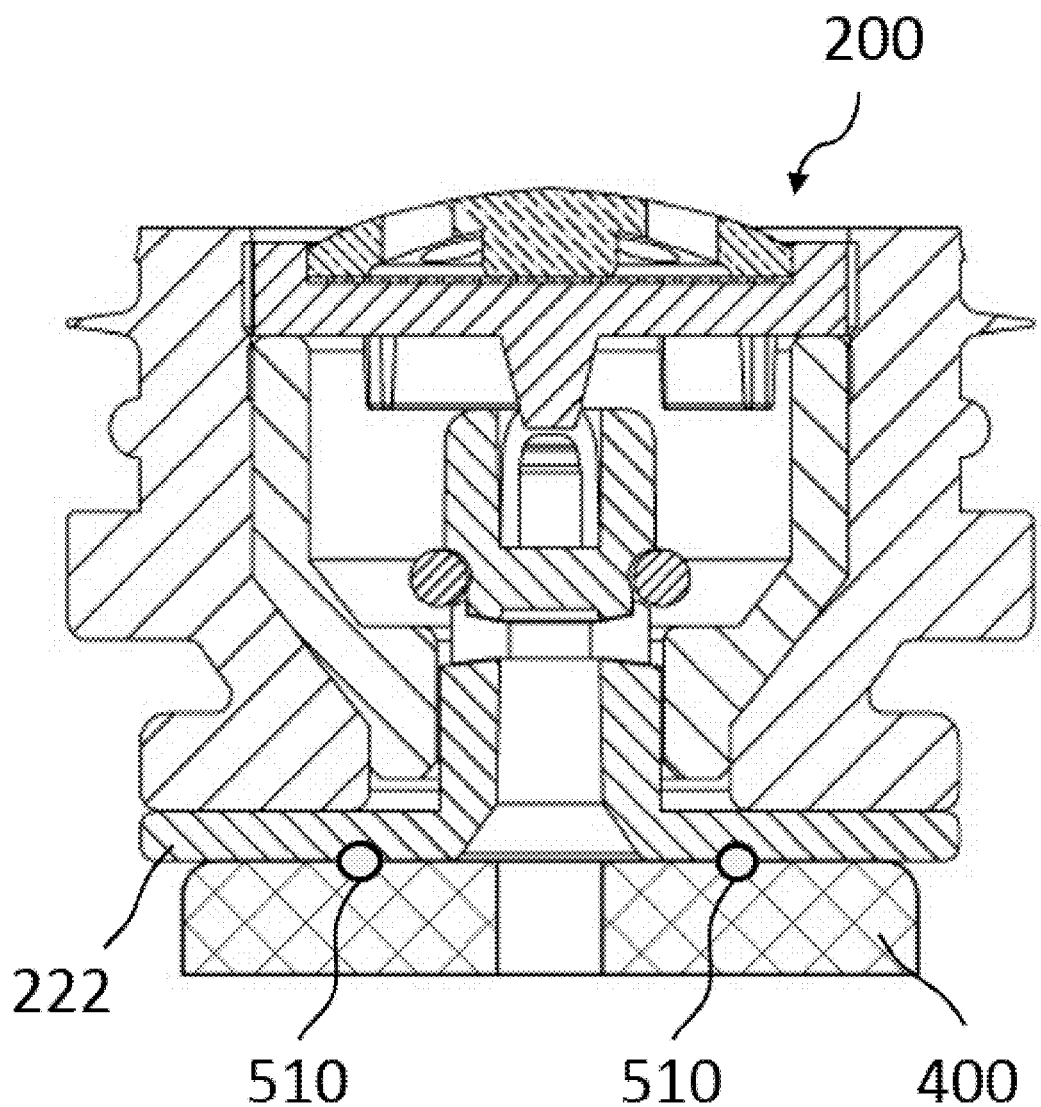
FIG. 8b is a cross-sectional view of the quick-release valve module with a hermetic seal formed between the elastic sealing ring and a gas filling device panel.

Various embodiments of elastic sealing members are detailed below. These elastic sealing members serve to give a better hermetic seal for the quick-release valve module 200, so as to prevent other foreign fluids from entering the reticle pod and undermine the purity of the fluid that flows within. Please refer to FIG. 8a, which illustrates a cross-sectional view of the quick-release valve module provided with an elastic sealing band and a groove for receiving the elastic sealing band, and also to FIG. 8b, which illustrates a cross-sectional view of the quick-release valve module with a hermetic seal formed by the elastic sealing band and the gas filling device panel. In FIG. 8a, an elastic sealing ring 510, such as an O-ring, is disposed on the side of the disc portion 222 that contacts the gas filling panel 400, and on the same side of the disc portion 222, a groove 511 for receiving the elastic sealing ring 510 is also provided on the surface. As shown in FIG. 8b, when the gas filling panel 400 pushes the disc portion 222, a hermetic seal is formed, with the elastic sealing ring 510 positioned between the disc portion 222 and the gas filling panel 400.

Figure 9A:
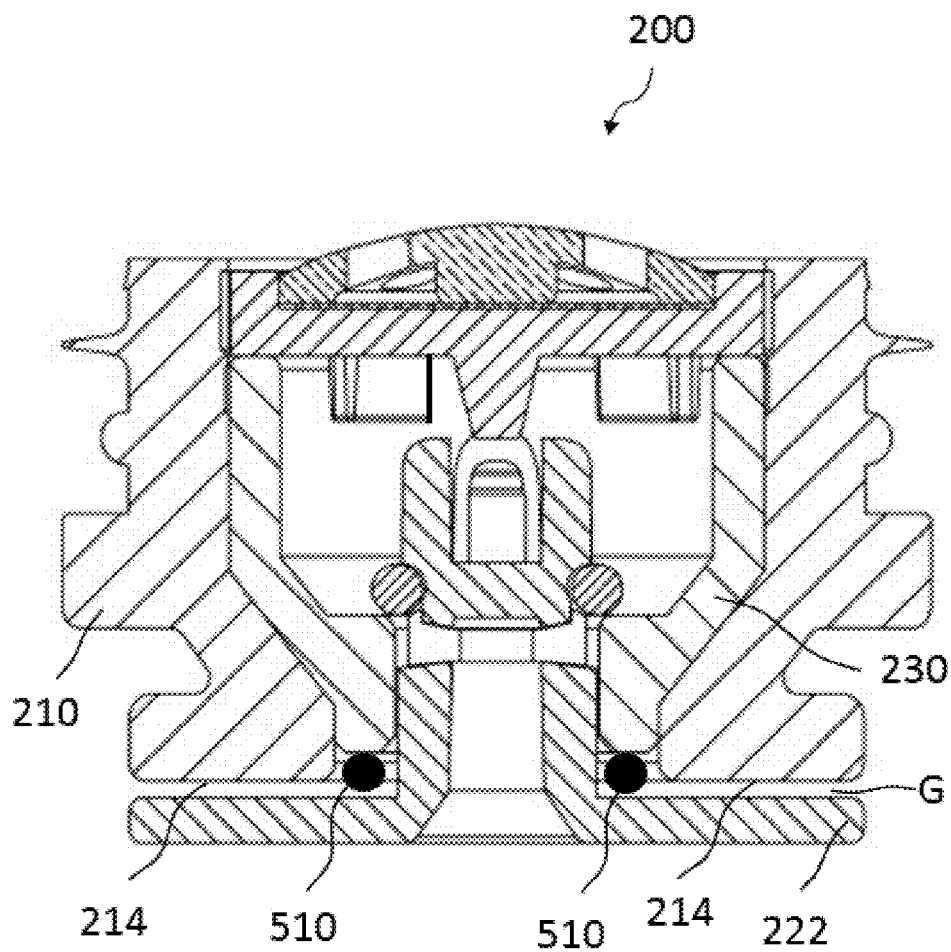
FIG. 9a is a cross-sectional view of the quick-release valve module before the gas filling process begins, with an elastic sealing ring according to another embodiment of the invention.
Figure 9B:
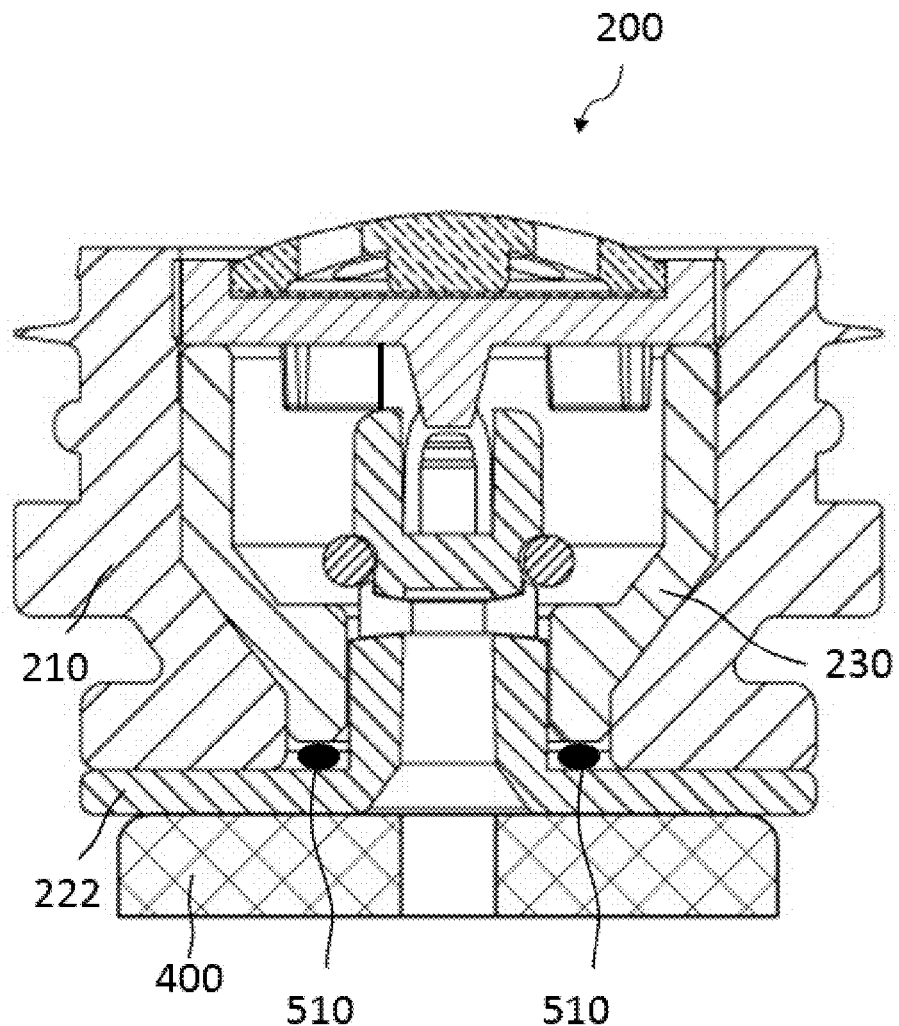
FIG. 9b is a cross-sectional view of the quick-release valve module with a hermetic seal formed between the elastic sealing ring and a gas filling device panel according to another embodiment of the invention.

The present invention further provides another embodiment of the elastic sealing ring 510. FIG. 9a is a cross-sectional view of the quick-release valve module 200 with a different type of elastic sealing ring 510 before the gas filling process begins, and FIG. 9b is a cross-sectional view of the quick-release valve module 200 with a hermetic seal formed by the elastic sealing ring 510 and the gas filling panel 400. As shown in FIGS. 9a and 9b, an elastic sealing ring 510 is further disposed on the circumference at the end of the cylindrical base 230 that faces toward the disc portion 222 of the piston, wherein the elastic sealing ring 510 is securely attached to the end portion of the cylindrical base 230 and protrudes from the annular sealing surface 214 of the flexible grommet 210 when viewed from the position of the gap G toward the quick-release valve module 200. When the gas filling panel 400 pushes the disc portion 222, the elastic sealing ring 510 will be squeezed and deformed by the disc portion 222, and a hermetic seal will be formed between the disc portion 222 and the cylindrical base 230; thus, the particles cannot enter the inner space of the quick-release valve module 200 via the gap between the flexible grommet 210 and the disc portion 222. In addition, there is no need to process the surface of the disc portion to form a groove (as described above) for receiving the elastic sealing ring 510. Alternatively, the elastic sealing ring 510 may be formed or disposed on the disc portion 222, facing toward the cylindrical base 230.

Figure 10A:
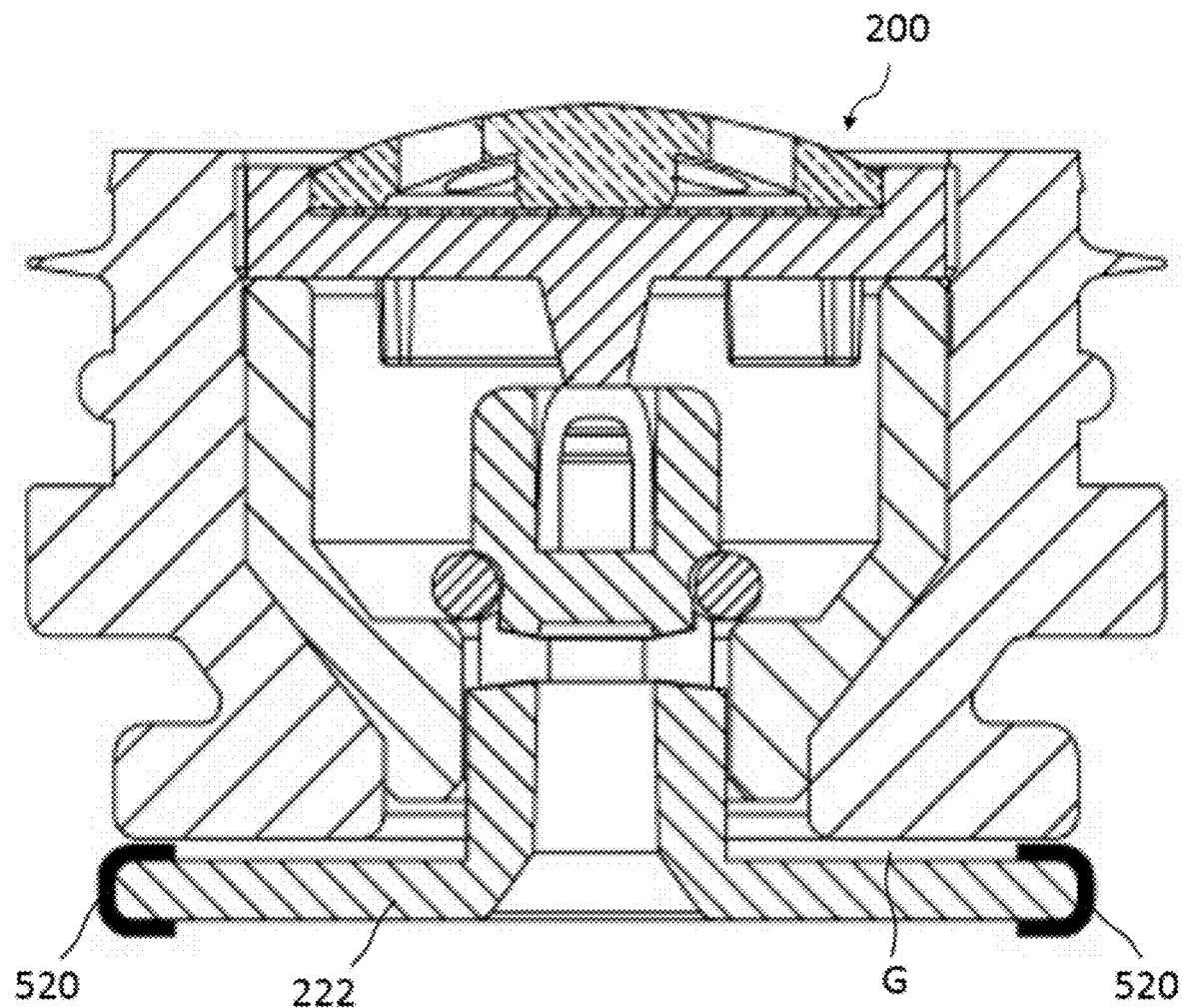
FIG. 10a is a cross-sectional view of the quick-release valve module with an elastic sealing band according to an embodiment of the invention.
Figure 10B:
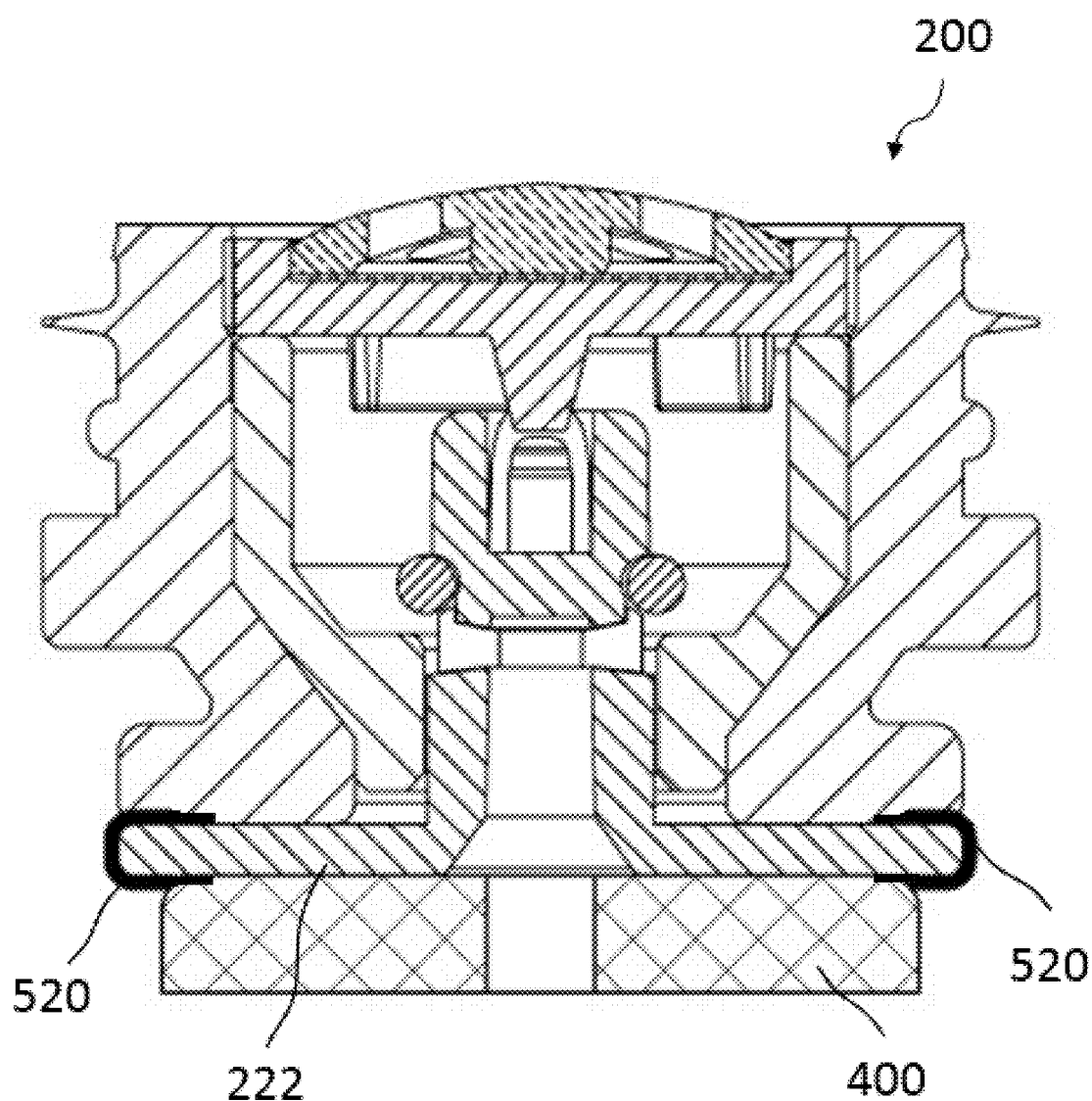
FIG. 10b is a cross-sectional of the quick-release valve module with a hermetic seal formed between the elastic sealing band and a gas filling device panel.

FIG. 10a is a cross-sectional view of the quick-release valve module with an elastic sealing band; FIG. 10b is a cross-sectional view of the quick-release valve module with a hermetic seal formed between the elastic sealing band and a gas filling device panel. In FIG. 10a, an elastic sealing band 520 extending inward in the radial direction is disposed on the disc portion 222 and fits the circumference of the disc portion, wherein the thickness of the elastic sealing band 520 is smaller than the width of gap G and does not affect the operation of the piston 220. FIG. 10b shows that when the gas filling panel 400 pushes the disc portion 222, the elastic sealing band 520 will be positioned between the circumference of the disc portion 222 and the circumference of the gas filling panel 400 to form a hermetic seal.

Figure 11:
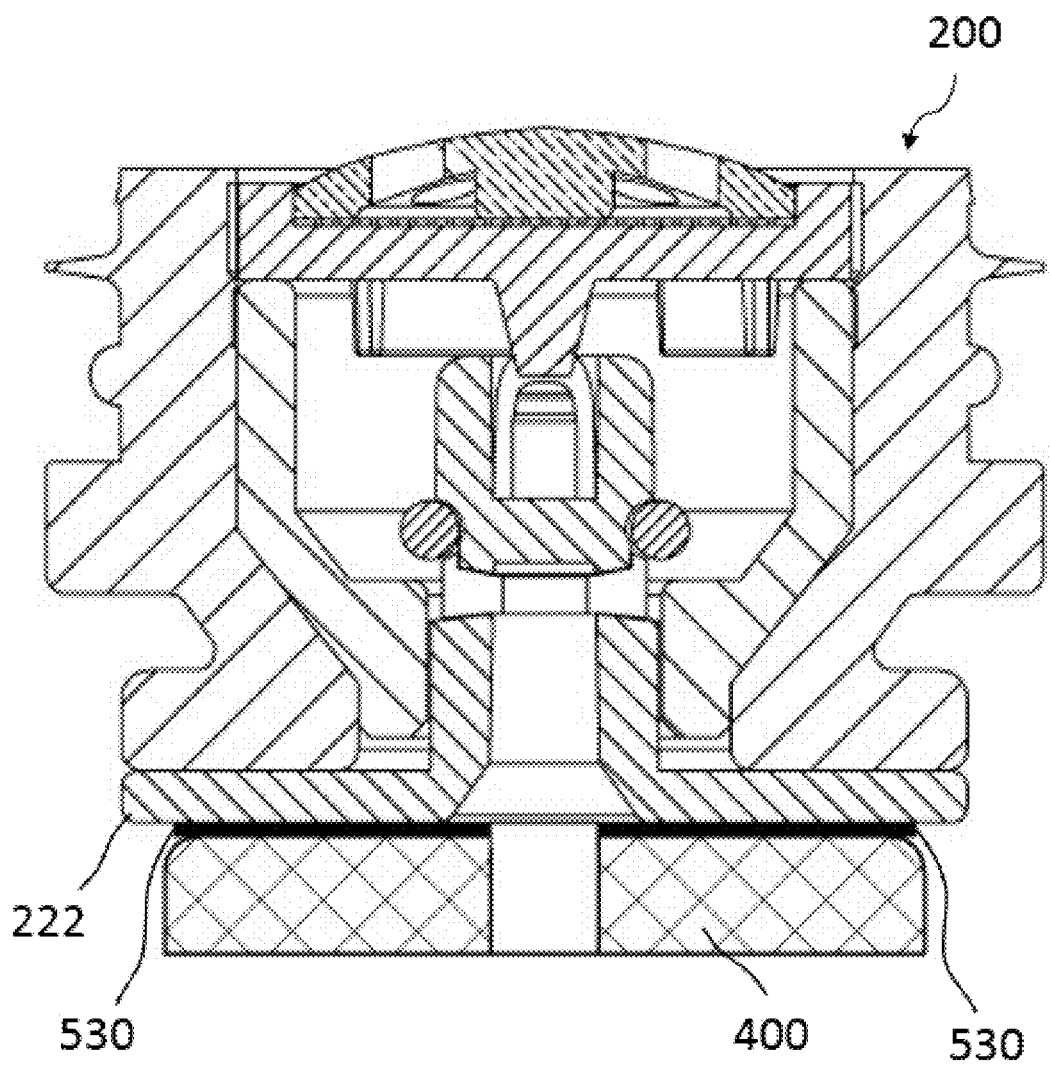
FIG. 11 is a cross-sectional view of the quick-release valve module with a hermetic seal formed between an elastic sealing pad and a gas filling device panel according to an embodiment of the invention.

FIG. 11 shows a cross-sectional view of the quick-release valve module with an elastic sealing pad. As shown in FIG. 11, an elastic sealing pad 530 is disposed on the surface of the disc portion 222 on the side with which the gas filling panel 400 has in contact. When the gas filling device panel 400 pushes the disc portion 222, the elastic sealing pad 530 will be positioned between the disc portion 222 and the gas filling panel 400 to form a hermetic seal.

To sum up, using an elastic sealing member (e.g., the elastic sealing ring 510, elastic sealing band 520, and elastic sealing pad 530) as shown in FIGS. 8 to 11 can prevent external air from entering the quick-release valve module via a channel that is created if the gas filling panel 400 does not come in full contact with the disc portion 222 while pushing it. As such, the purity of the fluid flowing into the quick-release valve module can be further increased. Also, as gas particles from the outside can be kept away from causing damage to the mechanisms of the quick-release valve module, the service life of the valve module can be extended. Moreover, given that these elastic sealing members can be replaced more easily, an enhanced sealing capability can be achieved using low-cost components.

What is claimed is:

1. A quick-release valve module, adapted for used in an air passage, comprising:
    a flexible grommet defining a channel;
    a cylindrical base received at least in part in the channel;
    a filter module configured to filter an air flow from the channel;
    a piston having a disc portion at an end thereof and another end of the piston receiving within the cylindrical base; and
    an elastic member disposed between the another end of the piston and the filter module,
    wherein the disc portion of the piston is exposed to the channel,
    wherein the disc portion is configured to seal the channel of the flexible grommet when an external force is applied thereto and depart from the flexible grommet when no external force is applied.

2. The valve module as claimed in claim 1, wherein the piston includes a rod portion having an inner passage and the disc portion radially extending from the rod portion, the rod portion is slidable relatively to the cylindrical base under an external force applied to the disc portion, and whereby the inner passage of the rod portion and the air passage communicate with each other.

3. The valve module as claimed in claim 2, wherein the flexible grommet has a groove formed at the peripheral thereof, the groove is configured for engagement with an annular securing member which is used for locking the quick-release valve module in the air passage.

4. The valve module as claimed in claim 2, wherein the rod portion is provided with a sealing ring which forms a sealing between the rod portion and the cylindrical base.

5. The valve module as claimed in claim 1, wherein the filter module has a support member extending in the cylindrical base to push against the elastic member.

6. The valve module as claimed in claim 1, wherein the flexible grommet has an annular sealing surface radially extending from an edge of the channel, the annular sealing surface is configured to cooperate with the disc portion of the piston to form a sealing.

7. The valve module as claimed in claim 1, wherein the disc portion of the piston is further provided with an elastic sealing ring and a groove receiving the elastic sealing ring.

8. The valve module as claimed in claim 1, wherein the disc portion of the piston is further provided with an elastic sealing band radially extending inward so as to fit the circumference of the disc portion.

9. The valve module as claimed in claim 1, wherein the disc portion of the piston is further provided with an elastic sealing pad.

10. The valve module as claimed in claim 1, wherein the flexible further includes plural elastic flaps which are configured to form a sealing with a valve seat defining the air passage when the quick-release valve module is received in the air passage.

11. The valve module as claimed in claim 1, wherein the cylindrical base, at a side that faces the disc portion of the piston, is further provided with an elastic sealing ring.

12. The valve module as claimed in claim 11, wherein the elastic sealing ring is configured to form a sealing between the disc portion and the cylindrical base when the disc is pushed by a gas filling panel.

13. The valve module as claimed in claim 1, wherein the valve module is provided in a reticle pod, the reticle pod comprising a base with a base board, the base provided with plural valve seats each of which defines an air passage, and the base board having plural openings corresponding to the valve seats, wherein:
    the valve module further has an annular securing member configured at a periphery of the flexible grommet;
    the valve module having the annular securing member passes through the opening of the base board, and receives a part of the flexible grommet in the valve seat of the base; and
    the annular securing member pushes against an edge of the opening in order to secure the valve module in the valve seat.

14. A reticle pod provided with a quick-release valve module, the reticle pod comprising a base with a base board, the base provided with plural valve seats each of which defines an air passage, and the base board having plural openings corresponding to the valve seats, wherein each of the valve seats is provided with the quick-release valve module, the quick-release valve module comprising:
    a flexible grommet defining a channel;
    a cylindrical base received at least in part in the channel;
    a filter module coupling to the cylindrical base for filtering an air flow from the channel;
    a piston having a part received within the cylindrical base;
    an elastic member disposed between the piston and the filter module; and
    an annular securing member connecting to a periphery of the flexible grommet,
    wherein the part of the piston is slidable relatively to the cylindrical base due to the elastic member, and the annular securing member pushes against an edge of the opening of the base board so that the quick-release valve module is locked in the valve seat,
    wherein the disc portion is configured to seal the channel of the flexible grommet when an external force is applied thereto and depart from the flexible grommet when no external force is applied.

15. The reticle pod as claimed in claim 14, wherein the piston includes a rod portion having an inner passage and a disc portion radially extending from the rod portion, and the disc portion is exposed to the flexible grommet, the rod portion is slidable relatively to the cylindrical base under an external force applied to the disc portion, and whereby the inner passage of the rod portion and the air passage communicate with each other.

16. The reticle pod as claimed in claim 15, wherein the flexible grommet has an annular sealing surface radially extending from an edge of the channel, the annular sealing surface is configured to cooperate with the disc portion of the piston to form a sealing.

17. The reticle pod as claimed in claim 15, wherein the disc portion of the piston is further provided with an elastic sealing ring and a groove receiving the elastic sealing ring.

18. The reticle pod as claimed in claim 15, wherein the cylindrical base, at a side that faces the disc portion of the piston, is further provided with an elastic sealing ring.

19. The reticle pod as claimed in claim 18, wherein the elastic sealing ring is configured to form a sealing between the disc portion and the cylindrical base when the disc is pushed by a gas filling panel.

20. The reticle pod as claimed in claim 15, wherein the disc portion of the piston is further provided with an elastic sealing band radially extending inward so as to fit the circumference of the disc portion.

21. The reticle pod as claimed in claim 15, wherein the disc portion of the piston is further provided with an elastic sealing pad.

22. The reticle pod as claimed in claim 14, wherein the filter module has a support member extending in the cylindrical base to push against the elastic member.

23. The reticle pod as claimed in claim 14, wherein the flexible further includes plural elastic flaps which are configured to form a sealing with a valve seat defining the air passage when the quick-release valve module is received in the air passage.

24. The reticle pod as claimed in claim 14, wherein the annular securing member has a pair of ear portions extending therefrom, and each of the openings of the base board has a pair of notches adapted for the pair of ear portions such that the quick-release valve module is passable through the opening and secured in the valve seat when the pair of ear portions pushes against an edge of the opening.

25. A quick-release valve module, comprising:
a flexible grommet having a channel defined therein, a restricting surface perpendicular to the extension of channel and a side surface adjacent to the restricting surface; and
an annular securing member matching with the side surface of the flexible grommet and having at least one ear portion which is configured to cooperate with at least one notch of an opening defined on a reticle pod base in order to selectively install the flexible grommet,
wherein the quick-release valve module passes through the opening by the ear portion passing through the notch of the opening.

26. The quick-release valve module as claimed in claim 25, wherein the annular securing member further touches against the restricting surface of the flexible grommet.

27. The quick-release valve module as claimed in claim 25, wherein the side surface adjacent to the restricting surface further has a recessed surface defined thereon, and the annular securing member matches with the recessed surface of the side surface.

28. The quick-release valve module as claimed in claim 25, wherein the flexible grommet further has an annular sealing surface extending from an edge of the channel.

29. The quick-release valve module as claimed in claim 25, wherein the ear portion protrudes to a radius out of the restricting surface of the flexible grommet.

30. A method for loading a quick-release valve module in a reticle pod, comprising:
providing a base having an opening formed thereon and configured to receive the quick-release valve module, wherein the opening has at least one notch;
providing the quick-release valve module comprising a flexible grommet and an annular securing member, wherein the flexible grommet has a channel defined therein, a restricting surface perpendicular to the extension of the channel and a side surface adjacent to the restricting surface, the annular securing member matches with the side surface of the flexible grommet and has at least one ear portion; and
passing the flexible grommet and the ear portion through the opening and notch of the base and rotating the annular securing member to selectively install the flexible grommet, and the quick-release valve module passes through the opening by the ear portion passing through the notch of the opening.

31. The method as claimed in claim 30, wherein the base has a base board that defines the opening, and the base board is pushed by the ear portion after a rotation of the ear portion so that the flexible grommet is installed.

32. The method as claimed in claim 30, wherein the base has a valve seat coupled to an interior of the reticle pod, a periphery of the flexible grommet and the valve seat form a sealing, and the channel of the flexible grommet communicates with the interior of the reticle pod.

33. The method as claimed in claim 30, wherein the annular securing member further touches against the restricting surface of the flexible grommet.

34. The method as claimed in claim 30, wherein the side surface adjacent to the restricting surface further has a recessed surface defined thereon, and the annular securing member matches with the recessed surface of the side surface.

* * * * *